United States Patent [19]

Ipri et al.

[11] Patent Number: 4,791,464
[45] Date of Patent: Dec. 13, 1988

[54] SEMICONDUCTOR DEVICE THAT MINIMIZES THE LEAKAGE CURRENT ASSOCIATED WITH THE PARASITIC EDGE TRANSISTORS AND A METHOD OF MAKING THE SAME

[75] Inventors: Alfred C. Ipri, Hopewell Township, Mercer County; Dora Plus, South Bound Brook, both of N.J.

[73] Assignee: General Electric Company, Schenectady, N.Y.

[21] Appl. No.: 48,704

[22] Filed: May 12, 1987

[51] Int. Cl.$^4$ .................... H01L 27/12; H01L 29/78
[52] U.S. Cl. .................... 357/23.7; 357/23.11
[58] Field of Search .................... 357/23.7, 23.11, 23.12

[56] References Cited

U.S. PATENT DOCUMENTS

| | | | |
|---|---|---|---|
| 3,890,632 | 6/1975 | Ham et al. | 357/23.7 |
| 4,015,279 | 3/1977 | Ham | 357/23.7 |
| 4,054,894 | 10/1977 | Heagerty et al. | 357/23.7 |
| 4,054,895 | 10/1977 | Ham | 357/23.7 |
| 4,070,211 | 1/1978 | Harari | 148/187 |
| 4,178,191 | 12/1979 | Flatley | 148/1.5 |
| 4,185,319 | 1/1980 | Stewart | 365/185 |
| 4,252,574 | 2/1981 | Fabula | 148/1.5 |
| 4,393,572 | 7/1983 | Policastro et al. | 29/571 |

OTHER PUBLICATIONS

Stewart, "CMOS/SOS EAROM Memory Arrays", *IEEE Journal of Solid-State Circuits*, vol. SC-14, No. 5, pp. 860-864, Oct. 1979.

*Primary Examiner*—William D. Larkins
*Attorney, Agent, or Firm*—Henry I. Steckler; James C. Davis, Jr.; Paul R. Webb, II

[57] ABSTRACT

A semiconductor device comprising an island of semiconductor material disposed on an insulating substrate is disclosed. A MOS transistor is formed in the semiconductor island such that the gate electrode extends over the sidewalls of the island. Diodes are formed between the source and drain regions and the portions of the channel region along the sidewalls to electrically isolate the top transistor from the parasitic edge transistors.

8 Claims, 5 Drawing Sheets

SEMICONDUCTOR DEVICE THAT MINIMIZES THE LEAKAGE CURRENT ASSOCIATED WITH THE PARASITIC EDGE TRANSISTORS AND A METHOD OF MAKING THE SAME

The present invention relates to a semiconductor device in which the parasitic edge transistors are electrically isolated from the top transistor.

BACKGROUND OF THE INVENTION

Silicon-on-insulator (SOI) semiconductor devices generally include a silicon island formed on the surface of an insulating material. A metal-oxide-semiconductor (MOS) transistor is formed in and on the silicon island. When the insulating material is a sapphire substrate, the structure is known as a silicon-on-sapphire (SOS) semiconductor device. However, the insulating material may also be a layer of silicon dioxide which is disposed on a semiconductor substrate. MOS/SOI transistors generally have higher speed and improved radiation hardness in comparison with MOS transistors formed in bulk silicon.

Referring now to FIG. 1, a conventional silicon-on-insulator semiconductor device is generally designated as 10. The device 10 is a silicon-on-sapphire semiconductor device because a silicon island 12 is formed on a sapphire substrate 14. The silicon island 12 is doped P-type; however, it also contains N-type source and drain regions 13 and 15, respectively. A gate oxide (not shown) is disposed on the surfaces of the silicon island 12 under at least the gate electrode 20. The device 10 actually consists of three transistors in parallel. The first transistor is on the top surface 16 of the silicon island 12. Two transistors are also formed along the opposed sidewalls 18 of the silicon island 12. The opposed sidewalls 18 lie under the gate electrode 20 and extend along the channel length of the SOS device. The transistors formed along the opposed sidewalls 18 are commonly referred to as parasitic edge transistors.

The parasitic edge transistors have a lower threshold voltage than the top transistor. The parasitic edge transistors are also strongly susceptible to contamination from the underlying substrate material which causes the threshold voltage of the edge transistor to shift. This shifting threshold voltage can cause the edge transistor to turn on making the overall transistor appear to have a high leakage current. The parasitic edge transistor problem is more pronounced in N-channel devices when such devices are exposed to ionizing radiation. The ionizing radiation causes positive charges to build up in the gate oxide along the edge of the transistor. The positive charges turn on the edge transistor before the top transistor and a leakage path is created between the source and drain.

Commonly assigned U.S. Pat. No. 3,890,632 entitled "Stabilized Semiconductor Devices And Method of Making The Same" which issued to W. E. Ham et al. on June 17, 1975 describes a technique for decreasing the leakage currents associated with the edge transistors. In an N-channel device, the sloped sidewalls of the silicon island are ion implanted with boron before the gate electrode is applied. This doping step increases the threshold voltage of the channel region which is under the portion of the gate electrode which passes down the sidewall of the silicon island. By increasing the doping concentration of the channel region of the edge transistor, the threshold voltage is significantly increased and the leakage currents associated with the premature turn on of the edge transistor are reduced.

Since all of the sidewalls of the silicon island in U.S. Pat. No. 3,890,632 have an increased P-type doping concentration, the breakdown voltage between the channel region and the drain region of this device is significantly lowered. In order to overcome this problem, commonly assigned U.S. Pat. No. 4,054,895 entitled "Silicon-On-Sapphire Mesa Transistor Having Doped Edges" issued to W. E. Ham on Oct. 18, 1977 discloses a technique of raising the threshold voltage of the edge transistors by doping the channel edge regions adjacent the source region. The portions of the channel edge region adjacent the drain are not doped and this provides a higher breakdown voltage between the channel region along the sidewall and the drain.

When the channel length of the device is on the order of a few microns, it is difficult to selectively dope only a portion of the channel region as described in U.S. Pat. No. 4,054,895. Thus, a technique is needed to minimize leakage associated with the parasitic edge transistor in semiconductor devices which have short channel lengths.

SUMMARY OF THE INVENTION

The present invention includes a semiconductor device with an island of semiconductor material disposed on an insulating substrate. A gate insulating layer and a gate electrode are both disposed over the island of semiconductor material. The gate electrode is positioned such that it overlies the top surface and at least one sidewall of the silicon island. A channel region of a first conductivity type is also disposed in the island under the gate electrode and along the at least one sidewall. The channel region has a substantially uniform first conductivity type concentration along the top surface and along the upper portions of the at least one sidewall of the island. The device also includes source and drain regions of a second conductivity type disposed in the island, but separated by the channel region. First regions of a first conductivity type are disposed in the portions of the island not subtended by the gate electrode and contacting the source and drain regions to form diodes with the source and drain for electrically isolating the drain region from the portion of the channel region along the at least one sidewall. Second regions of a first conductivity type are also disposed in the portions of the island not subtended by the gate electrode to separate the first regions forming diodes with the drain region from the portion of the channel region along the at least one sidewall. The second regions have a higher first conductivity type concentration than the first regions forming diodes with the drain region. A method for fabricating this device is also included in the present invention.

DETAILED DESCRIPTION OF THE PREFERRED EMBODIMENT

The present invention will be described using single-crystalline silicon as the semiconductor material which is disposed on an insulating substrate of single-crystalline sapphire. However, it should be understood that other conventional semiconductor materials, such as other forms of silicon and IIb-VIa and IIIa-Va semiconductor compounds, may be substituted for single-crystalline silicon. Additionally, other conventional insulator substrates, such as spinel, beryllium oxide, and silicon dioxide disposed on a semiconductor material, may be substituted for sapphire.

Figure 1:
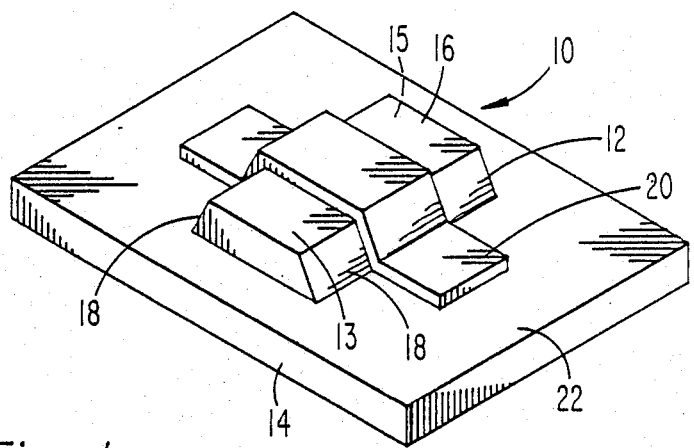
FIG. 1 is an isometric view of a conventional N-channel SOS semiconductor device illustrating the parasitic edge transistors.
Figure 2A:
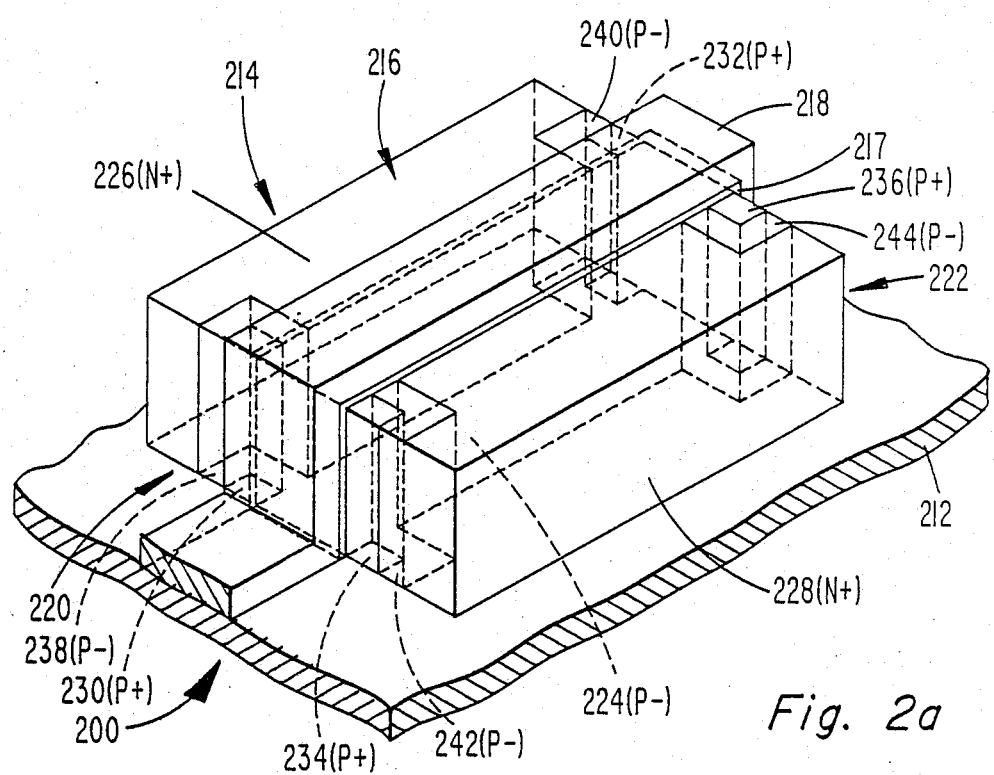
FIGS. 2a and 2b are isometric and plan views, respectively, of the first embodiment of the present invention.
Figure 2B:
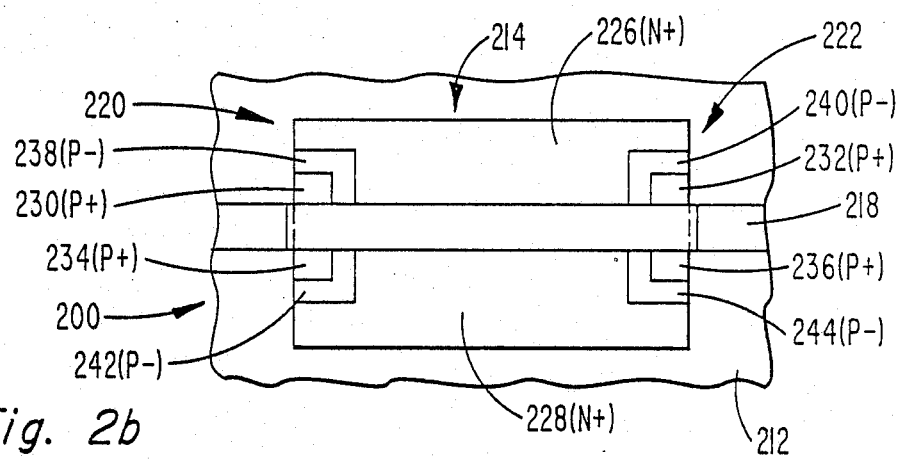

Referring now to FIGS. 2a and 2b, the N-channel SOS transistor of the first embodiment of the present invention is generally designated as 200. The transistor 200 includes a single-crystalline sapphire substrate 212 upon which is disposed a lightly doped P-type (P−) single crystalline silicon island 214. The silicon island 214 has a thickness of about 0.5 micrometer. A gate electrode 218, such as N-type polycrystalline silicon, is disposed over a top surface 216 and over the opposed sidewalls 220 and 222 of the silicon island 214. A gate insulating layer 217, such as silicon dioxide, is disposed between the gate electrode 218 and the silicon island 214. A lightly doped P-type (P−) channel region 224 is disposed under the gate electrode 218 in the silicon island 214. The channel region 224 also extends to the opposed sidewalls 220 and 222 of the silicon island 214. The lightly doped P-type channel region 224 has a substantially uniform impurity concentration of about $10^{16}$ cm$^{-3}$ along the top surface 216 and along the upper portions of the opposed sidewalls 220 and 222. However, the back channel portions of the channel region 224 adjacent the sapphire substrate 212 may be heavily doped P-type to reduced radiation-induced back channel leakage currents.

The SOS transistor 200 also includes heavily doped N-type (N+) source and drain regions 226 and 228, respectively, which extend from the top surface 216 of the silicon island 214 to the interface between the silicon island 214 and the sapphire substrate 212. The source 226 and drain 228 regions are separated by the lightly doped P-type (P−) channel region 224. The heavily doped N-type (N+) source 226 and drain 228 regions each typically have an impurity concenrration of about $10^{20}$ cm$^{-3}$.

In order to electrically isolate the transistor formed on the top surface 216 from the two parasitic edge transistors formed in the opposed sidewalls 220 and 222 under the gate electrode 218, both heavily doped and lightly doped P-type regions are disposed in the silicon island 214. The heavily doped P-type (P+) regions 230, 232, 234, and 236 are formed in the silicon island 214 so that they contact a portion of the lightly doped P-type (P−) channel region 224 disposed along either of the opposed sidewalls 220 or 222. These heavily doped P-type (P+) regions 230, 232, 234 and 236 have an impurity concentration of about $10^{20}$ cm$^{-3}$. The heavily doped P-type (P+) regions 230, 232, 234 and 236 are separated from the heavily doped N-type (N+) source 226 and drain 228 regions by lightly doped P-type (P−) regions 238, 240, 242 and 244, having an impurity concentration of about $10^{16}$ cm$^{-3}$. The junctions between the heavily doped N-type (N+) source and drain regions 226 and 228, respectively, and the lightly doped P-type (P−) regions 238, 240, 242 and 244 form N+/P− diodes. These N+/P− diodes are disposed between each of the source 226 and drain 228 regions and the portions of the channel region 224 which extend to the opposed sidewalls 220 and 222.

It should be noted that the source and drain regions of the device 200 are interchangeable allowing this device to be used in bilateral transmission gates. Also, in the event that surfaces of the lightly doped P-type (P−) regions should invert, the heavily doped P-type (P+) regions on the drain side of the channel region 224 form reverse biased diodes with the inverted surfaces. These reverse biased diodes electrically isolate the drain region from the portions of the channel region 224 along the opposed sidewalls 220 and 222.

Figure 2C:
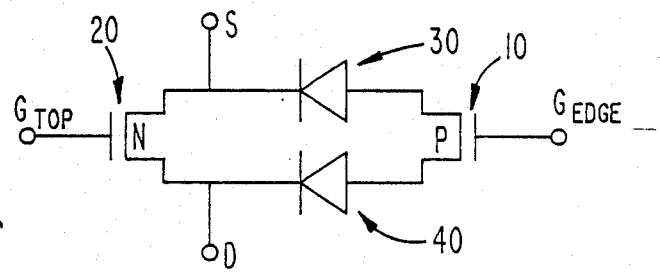
FIG. 2c is an electrical schematic drawing illustrating the means in the present invention used for electrically isolating the drain region from the portion of the channel region along the at least one sidewall.

Turning now to FIG. 2c, this electrical schematic illustrates the means used in the present invention for electrically isolating the drain (D) region from the edge transistor 10 formed in the opposed sidewalls of the silicon island. The edge transistor 10 formed in the sidewall is a P-channel depletion mode transistor, whereas the top transistor 20 formed in the top surface 216 (FIGS. 2a and 2b) of the silicon island is an N-channel enhancement mode transistor. Since the source (S) region of the N-channel transistor 20 is at the lower potential, typically ground, the N+/P− diode 30 adjacent the source (S) region is forward biased. However, the drain (D) region is typically at the higher potential thereby reverse biasing the N+/P− diode 40. The reversed biased N+/P− diode 40 serves to electrically isolate the drain region from the P-channel transistor 10 formed in the sidewall of the silicon island. FIG. 2c only shows a single pair of diodes; however, a second pair of diodes is also disposed in the silicon island adjacent opposite end of the gate electrode to isolate the drain region from the P-channel transistor formed in the opposite sidewall.

Figure 3A:
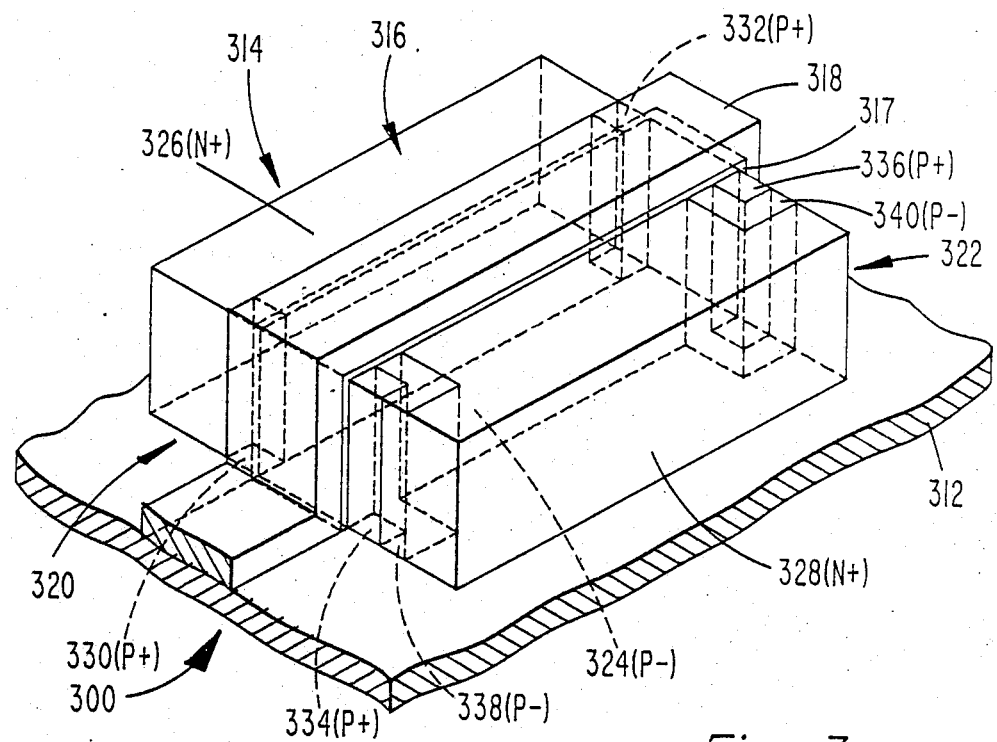
FIGS. 3a and 3b are isometric and plan views, respectively, of the second embodiment of the present invention.
Figure 3B:
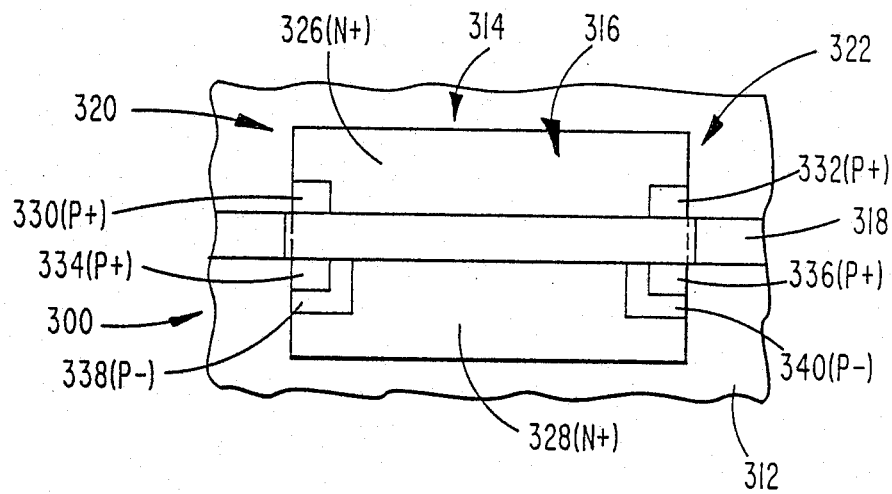

Referring now to FIGS. 3a and 3b, the second embodiment of the present invention is an N-channel SOS transistor generally designated as 300. This transistor 300 contains a sapphire substrate 312 upon which is disposed a lightly doped P-type (P−) silicon island 314. The device also contains a gate insulating layer 317, such as silicon dioxide, disposed under at least the gate electrode 318. The gate electrode 318, such as N-type polycrystalline silicon, is disposed over the top surface 316 and over the opposed sidewalls 320 and 322 of the silicon island 314. A lightly doped P-type (P−) channel region 324, having an impurity concentration of about $10^{16}$ cm$^{-3}$, is disposed in the island 314 and extends to the opposed sidewalls 320 and 322. This channel region 324 has substantially uniform P-type impurity concentration along the top surface 316 and along the upper portions of the opposed sidewalls 320 and 322. However, the back channel portion of the channel region 324 may be heavily doped P-type as discussed earlier with regard to device 200. The channel region 324 also separates the heavily doped N-type (N+) source 326 and drain 328 regions. These source 326 and drain 328 regions extend from the top surface 316 of the silicon island 314 to the interface with the sapphire substrate 312. The heavily doped N-type (N+) source and drain regions 326 and 328, respectively, each have an impurity concentration of about $10^{20}$ cm$^3$.

The transistor 300 also includes heavily doped P-type (P+) regions 330 and 332 disposed in the silicon island 314 so that they contact a portion of the lightly doped P-type (P−) channel region 324 disposed along either of the opposed sidewalls 320 or 322. These heavily doped P-type (P+) regions have an impurity concentration of about $10^{20}$ cm$^{-3}$. The junctions between the heavily doped P-type regions 330 and 332 and the N+ source region 326 form N+/P+ diodes. Since the source region 326 is at the lower potential, typically ground, the N+/P+ diodes adjacent the source region 326 are forward biased.

Heavily doped P-type (P+) regions 334 and 336, having an impurity concentration of about $10^{20}$ cm$^{-3}$, are also disposed in the island 314 contacting the portions of the channel region 324 extending along the opposed sidewalls 320 and 322. These heavily doped P-type (P+) regions 334 and 336 are separated from the heavily doped N-type (N+) drain region 328 by lightly doped P-type (P−) regions 338 and 340. The lightly doped P-type (P−) regions 338 and 340 have an impurity concentration of about $10^{16}$ cm$^3$. The lightly doped P-type (P−) regions 338 and 340 form junctions with the heavily doped N-type (N+) drain region 328. These junctions form N+/P− diodes which serve to electrically isolate the drain region 328 from the portion of the channel region 324 which extends along the opposed sidewalls 320 and 322. The electrical isolation occurs because the drain region 328 is at the higher potential thereby reverse biasing the N+/P− diodes formed with the lightly doped P-type (P−) regions 338 and 340. As discussed earlier with regard to the device 200, the heavily doped P-type (P+) regions 334 and 336 also electrically isolate the N+ drain region 328 from the portion of the channel region 324 which extends along the opposed sidewalls 320 and 322 when surface inversion occurs in the lightly doped P-type (P−) regions 338 and 340.

Device 300 differs from device 200 in that N+/P+ diodes, rather than N+/P− diodes, are disposed adjacent the source region. In both of the devices 200 and 300, the reverse biased N+/P− diodes adjacent the drain regions serve to electrically isolate the drain regions from the portion of the channel region under the gate electrode along the opposed sidewalls. The N+/P− diodes adjacent the drain regions in devices 200 and 300 have a higher reverse breakdown voltage than the N+/P+ diodes adjacent the source in the device 300. However, it should be noted that if the transistor is to be used in bilateral transmission gates, where the source and drain regions are reversible, then the device 200 must be utilized.

Figure 4:
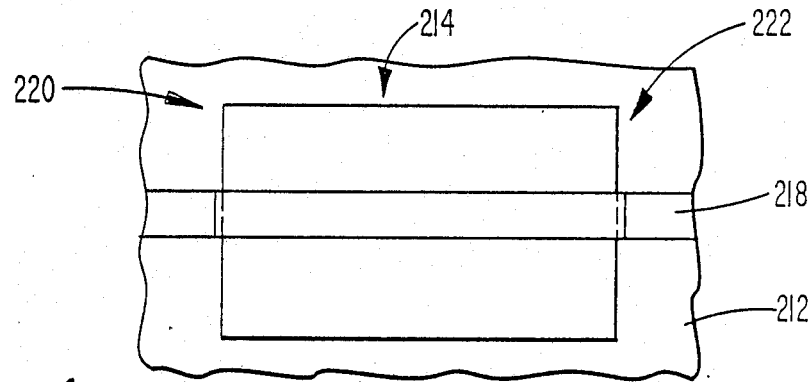
FIGS. 4 to 6 are plan views illustrating the method of the present invention for fabricating the device illustrated in FIGS. 2a and 2b.
Figure 5:
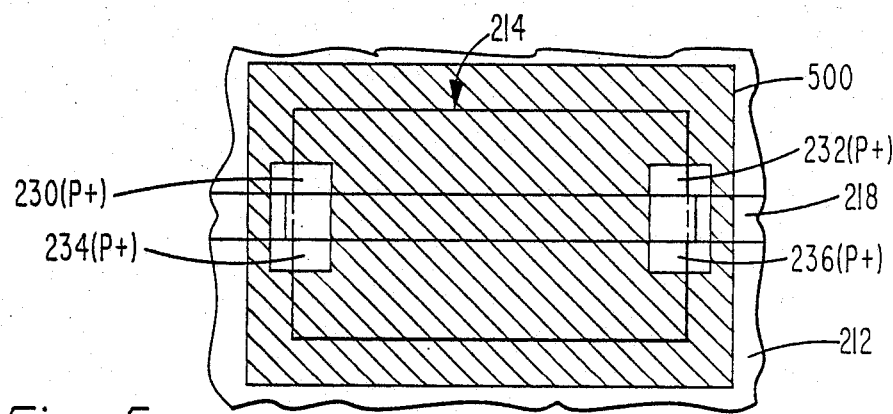
Figure 6:
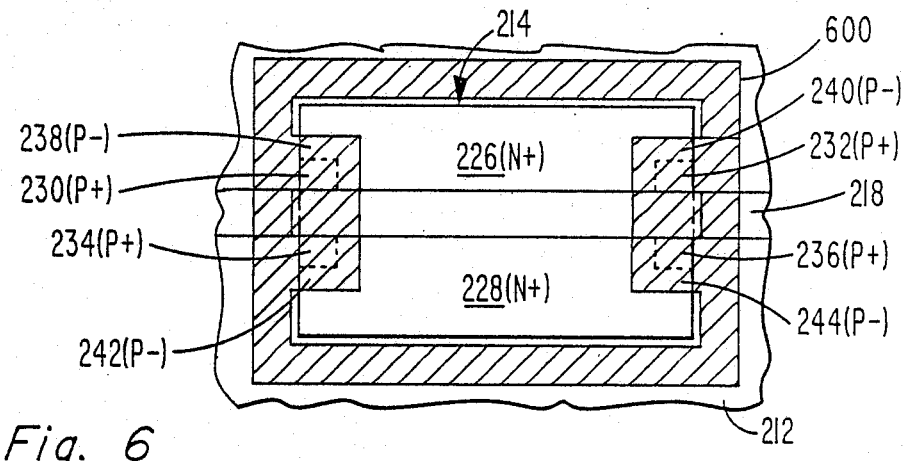

A method for fabricating the device 200 of the present invention is illustrated by FIGS. 4 to 6. Referring now to FIG. 4, the method begins with a sapphire substrate 212 upon which is disposed a lightly doped P-type (P−) silicon island 214. A gate insulating layer (not shown), such as silicon dioxide, is formed on the silicon island 214 under at least the locations where the gate electrode will lie. Then, a continuous layer of gate material (not shown), such as N-type polycrystalline silicon, is deposited over both the sapphire substrate 212 and the silicon island 214. A photoresist layer (not shown) is then applied and patterned such that it overlies the portions of both the silicon island 214 and the sapphire substrate 212 where the gate electrode will run. The gate electrode 218 is then defined using conventional etching techniques and the photoresist layer is removed.

Turning now to FIG. 5, a photoresist layer 500 is deposited and patterned over at least the silicon island 214. As shown in this FIGURE, portions of the silicon island 230, 232, 234 and 236 adjacent to the sidewalls 220 and 222 and the gate electrode 218 are exposed. Then, P-type dopants, such as boron, are implanted into the silicon island 214 using an energy of about 35 keV and a dosage of about $5 \times 10^{15}$ cm$^{-2}$ to form the heavily doped P-type (P+) regions 230, 232, 234 and 236. The photoresist layer 500 is then removed using conventional techniques.

As shown in FIG. 6, an additional photoresist layer 600 is deposited and patterned so as to expose the portions of the silicon island 214 where the heavily doped N-type source and drain regions 226 and 228, respectively, are to be located. Then, an N-type dopant, such as phosphorus, is implanted into the silicon island 214 using an energy of about 110 keV and a dosage of about $5 \times 10^{15}$ cm$^{-2}$ to form the source and drain regions. As can be seen in FIG. 6, the source and drain regions 226 and 228 are spaced from the heavily doped P-type (P+) regions 230, 232, 234 and 236 by portions of the original lightly doped P-type silicon island 238, 240, 242 and 244. Then, the photoresist layer 600 is removed using a conventional solvent and the device is completed using conventional MOS processing techniques. It should be noted that the step used to form the source 226 and drain 228 regions (FIG. 6) may be carried out before the step of forming the heavily doped P-type (P+) regions 230, 232, 234 and 236 (FIG. 5).

Figure 7:
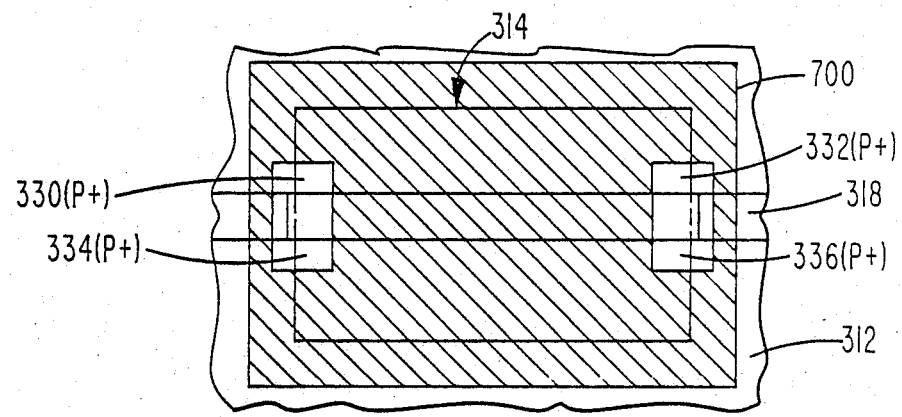
FIGS. 7 and 8 are plan views illustrating the method of the present invention for fabricating the device illustrated in FIGS. 3a and 3b.

Device 300, shown in FIGS. 3a and 3b, would be fabricated using a slightly modified version of the method illustrated by FIGS. 4 to 6. The processing steps described with regard to FIG. 4 would be carried out to form the gate insulating layer and gate electrode 318 over the silicon island 314. Then, as shown in FIG. 7, a photoresist layer 700 is deposited and patterned to expose the portions of the silicon island 314 where the heavily doped P-type (P+) regions 330, 332, 334 and 336 are to be located. Then, using the implant conditions described with regard to FIG. 5, boron is implanted into the silicon island 314 to form the heavily doped P-type (P+) regions 330, 332, 334 and 336. The photoresist layer 700 is then removed.

Figure 8:
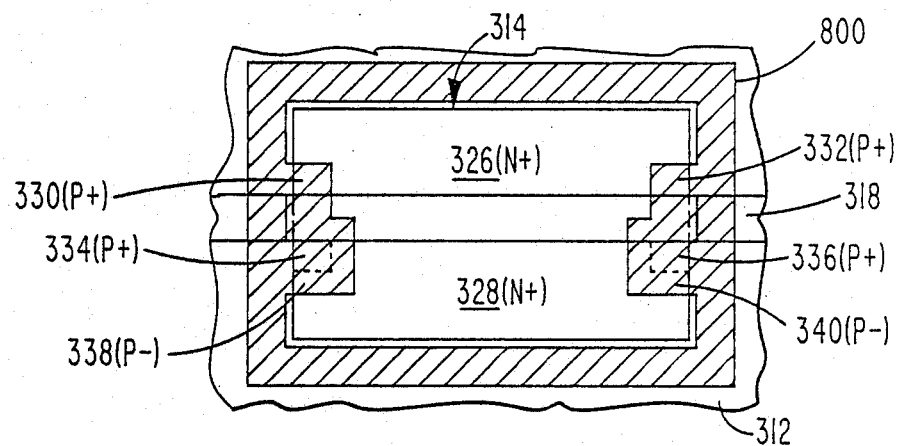

As shown in FIG. 8, an additional photoresist layer 800 is deposited and patterned to expose the portions of the silicon island 314 where the heavily doped N-type (N+) source 326 and drain 328 are to be located. Phosphorus is then implanted into the silicon island 314 in the manner described earlier with regard to FIG. 6. The photoresist layer 800 covers a portion of the lightly doped P-type silicon island 314 so that the lightly doped P-type (P−) regions 338 and 340 are formed such that they contact the heavily doped N-type (N+) drain 328. The heavily doped N-type (N+) drain 328 is spaced from the heavily doped P-type (P+) regions 334 and 336 by portions of the original lightly doped P-type silicon island 338 and 340. The photoresist layer 800 is removed and the device is completed using conventional MOS processing techniques. As with the method illustrated by FIGS. 4 to 6, the step used to form the source 326 and drain 328 regions (FIG. 8) may be carried out before the step of forming the heavily doped P-type (P+) regions 330, 332, 334 and 336 (FIG. 7).

Although the invention to this point has been described using N-channel transistors, the present invention is also applicable to P-channel transistors. The P-channel transistors would have the same orientation as illustrated in FIGS. 2a through 8 except for the reversal of the impurity type of all the regions. Additionally, the present invention is also particularly applicable to the formation of CMOS integrated circuits. Specifically, with the device illustrated in FIGS. 2a and 2b, the heavily doped P-type (P+) regions 230, 232, 234 and 236 can be fabricated during the implant steps used to form the source and drain regions for the P-channel transistor. In the same manner, the heavily doped P-type (P+) regions 330, 332, 334 and 336, shown in FIGS. 3a and 3b, can be fabricated during the implant steps used to form the source and drain regions of the P-channel transistor. Thus, the present invention can be fabricated in a conventional CMOS self-aligned source and drain processing sequence without the addition of any additional masks. The present invention has been decribed using substantially rectangular semiconductor islands, but other geometrical shapes, such as discs, could be substituted without departing from the scope of the invention.

The present invention avoids selectively doping he portions of the channel region adjacent the source as described in U.S. Pat. No. 4,054,895. The implantation steps of the present invention are performed after the gate electrode has been applied. Thus, short channel length devices with suppressed parasitic edge transistors can be fabricated.

We claim:

1. A semiconductor device, comprising
    an island of semiconductor material disposed on an insulating substrate, said island having a top surface and at least one sidewall;
    a gate insulating layer disposed over said island;
    a gate electrode disposed over said gate insulating layer such that it overlies said top surface and said at least one sidewall;
    a channel region of a first conductivity type disposed in said island under said gate electrode and along said at least one sidewall, said channel region having a substantially uniform first conductivity type concentration along said top surface and along the upper portions of said at least one sidewall;
    source and drain regions of a second conductivity type disposed in said island;
    first regions of a first conductivity type disposed in the portions of said island not subtended by said gate electrode and contacting said source and drain regions to form diodes with said source and drain regions for electrically isolating said drain region from the portion of the channel region along said at least one sidewall; and
    second regions of a first conductivity type disposed in the portions of the island not subtended by said gate electrode to separate said first regions forming diodes with said drain region from the portion of the channel region along said at least one sidewall, said second regions having a higher first conductivity type concentration than said first regions forming diodes with said drain region.

2. A semiconductor device according to claim 1 wherein said semiconductor material is silicon and said insulating substrate is sapphire.

3. A semiconductor device according to claim 2 wherein said first conductivity type is P-type and said second conductivity type is N-type.

4. A semiconductor device according to claim 3 wherein said first regions forming diodes with said source region and said second regions have a P-type concentration of about $10^{20}$ cm$^{-3}$ and said first regions forming diodes with said drain region have a P-type concentration of about $10^{16}$ cm$^{-3}$.

5. A semiconductor device, comprising
    an island of semiconductor material disposed on an insulating substrate, said island having a top surface and at least one sidewall;
    a gate insulating layer disposed over said island;
    a gate electrode disposed over said gate insulating layer such that it overlies said top surface and said at least one sidewall;
    a channel region of a first conductivity type disposed in said island under said gate electrode and along said at least one sidewall, said channel region having a substantially uniform first conductivity type concentration along said top surface and along the upper portions of said at least one sidewall;
    source and drain regions of a second conductivity type disposed in said island;
    first regions of a first conductivity type disposed in the portions of said island not subtended by said gate electrode and contacting said source and drain regions to form diodes with said source and drain regions for electrically isolating said drain region from the portion of the channel region along said at least one sidewall; and
    second regions of a first conductivity type disposed in said island to separate said first regions forming diodes with said source and drain regions from the portion of the channel region along said at least one sidewall, said second regions having a higher first type concentration than said first regions.

6. A semiconductor device according to claim 5 wherein said semiconductor material is silicon and said insulating substrate is sapphire.

7. A semiconductor device according to claim 6 wherein said first conductivity type is P-type and said second conductivity type is N-type.

8. A semiconductor device according to claim 7 wherein said first regions forming diodes with said source and drain regions have a P-type concentration of about $10^{16}$ cm$^{-3}$ and said second regions have a P-type concentration of about $10^{20}$ cm$^{-3}$.

* * * * *